(12) United States Patent
Nakanishi et al.

(10) Patent No.: US 9,907,177 B2
(45) Date of Patent: Feb. 27, 2018

(54) ELECTRONIC COMPONENT-USE PACKAGE AND PIEZOELECTRIC DEVICE

(71) Applicant: DAISHINKU CORPORATION, Kakogawa-shi, Hyogo (JP)

(72) Inventors: Kentaro Nakanishi, Kakogawa (JP); Ryuji Matsuo, Kakogawa (JP); Yuka Kojyo, Kakogawa (JP)

(73) Assignee: DAISHINKU CORPORATION, Hyogo (JP)

( * ) Notice: Subject to any disclaimer, the term of this patent is extended or adjusted under 35 U.S.C. 154(b) by 0 days.

(21) Appl. No.: 15/106,119

(22) PCT Filed: Dec. 5, 2014

(86) PCT No.: PCT/JP2014/006090
§ 371 (c)(1),
(2) Date: Jun. 17, 2016

(87) PCT Pub. No.: WO2015/092999
PCT Pub. Date: Jun. 25, 2015

(65) Prior Publication Data
US 2017/0034914 A1    Feb. 2, 2017

(30) Foreign Application Priority Data

Dec. 19, 2013  (JP) ................. 2013-262373
Dec. 19, 2013  (JP) ................. 2013-262374

(51) Int. Cl.
*H05K 1/18*    (2006.01)
*H03H 9/10*    (2006.01)
(Continued)

(52) U.S. Cl.
CPC .............. *H05K 1/181* (2013.01); *H03H 9/09* (2013.01); *H03H 9/1014* (2013.01);
(Continued)

(58) Field of Classification Search
CPC ..... H05K 1/181–1/184; H03H 9/1007–9/1092
See application file for complete search history.

(56) References Cited

U.S. PATENT DOCUMENTS

2009/0102315 A1    4/2009  Komada et al.
2009/0174291 A1*   7/2009  Nagano .............. H03H 9/1021
                                                         310/344
(Continued)

FOREIGN PATENT DOCUMENTS

JP          6-021251     3/1994
JP         2002-270709   9/2002
(Continued)

*Primary Examiner* — Hoa C Nguyen
(74) *Attorney, Agent, or Firm* — Norris McLaughlin & Marcus, P.A.

(57) ABSTRACT

An electronic component-use package includes a base that holds an electronic component element, and terminal electrodes formed on a bottom surface of the base. The terminal electrodes have chamfered parts facing corner parts of the base bottom surface and having angles of chamfer ranging in ±10 degrees to a reference line. The reference line is a perpendicular line to a straight line that connects the corner parts of the base bottom surface to a central part on one side of the terminal electrode in proximity to a center point of the base bottom surface, the reference line L8 passing through the chamfered parts.

15 Claims, 15 Drawing Sheets

(51) Int. Cl.
*H03H 9/09* (2006.01)
*H01L 23/498* (2006.01)
*H03H 9/02* (2006.01)

(52) U.S. Cl.
CPC .... *H01L 23/49805* (2013.01); *H01L 2924/0002* (2013.01); *H03H 9/02133* (2013.01); *H03H 9/1021* (2013.01)

(56) References Cited

U.S. PATENT DOCUMENTS

2012/0318572 A1   12/2012   Ishii et al.
2013/0098654 A1   4/2013   Iizuka et al.

FOREIGN PATENT DOCUMENTS

| JP | 2006-005027 | 1/2006 |
| JP | 2006-032645 | 2/2006 |
| JP | 2007-294649 | 11/2007 |
| JP | 2009-100353 | 5/2009 |
| WO | 2011/125519 | 10/2011 |

\* cited by examiner

F I G. 1 3
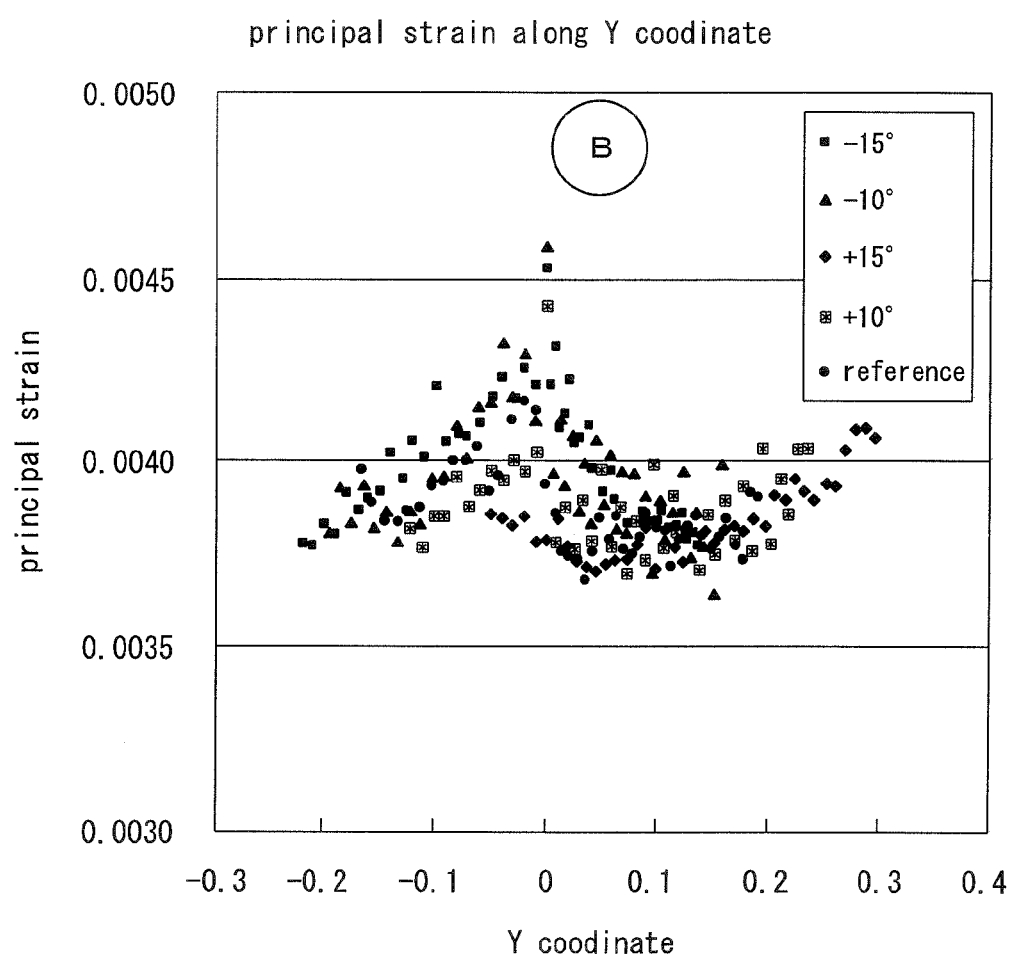

FIG. 22
(a) 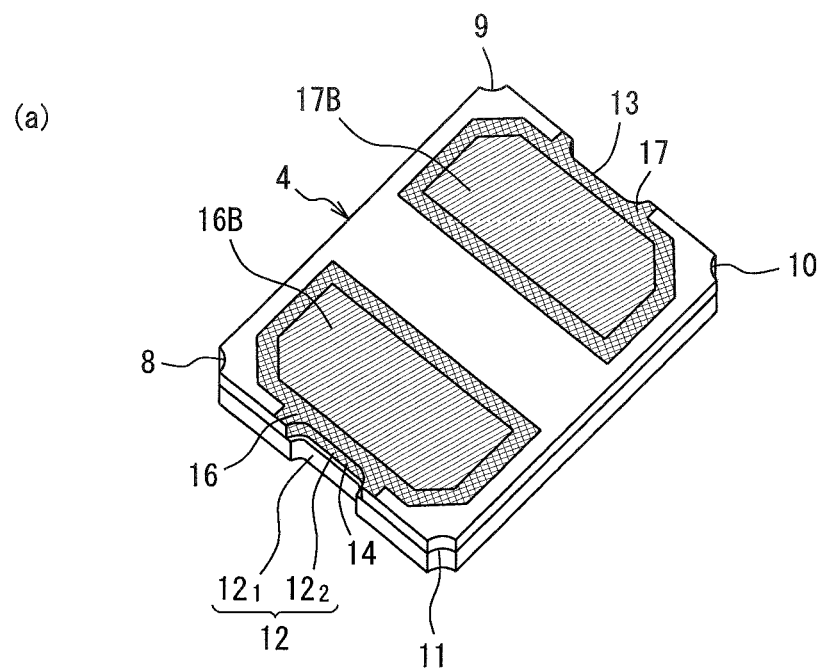
(b) 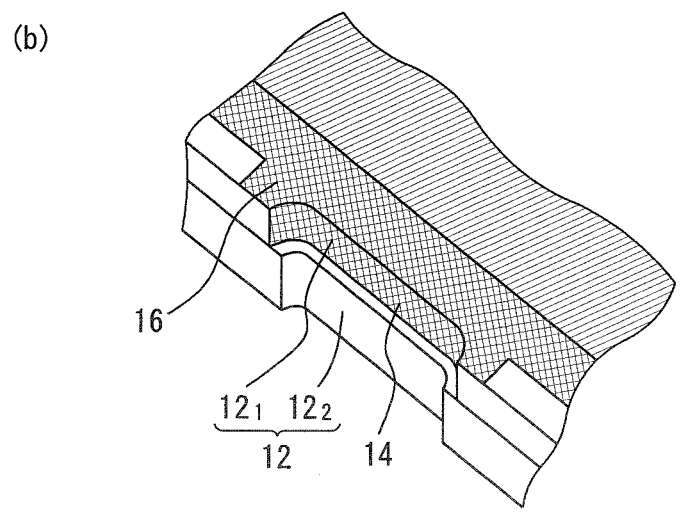

and PIEZOELECTRIC DEVICE

BACKGROUND OF THE INVENTION

This invention relates to an electronic component-use package of surface mounting type, and a piezoelectric device comprising the same.

Conventionally, electronic component-use packages of surface mounting type are typically used in electronic devices, specific examples of which may be piezoelectric devices of surface mounting type, including crystal vibrators, crystal filters, and crystal oscillators.

The piezoelectric device is structurally characterized in that a piezoelectric vibration piece having metal thin-film electrodes formed on a surface thereof is hermetically sealed in an electronic component-use package to protect these electrodes from exposure to outside air.

For easy processing and reasonable cost, circuit boards to be mounted with piezoelectric devices may typically be generally called glass epoxy substrates including mesh glass fibers impregnated with epoxy resins. The circuit board further includes solder paste applied by, for example, screen printing to an upper part of its electrode pattern. The package of the piezoelectric device has terminal electrodes, and these terminal electrodes are stacked in layers on the electrode pattern of the circuit board. Then, the circuit board is placed in a fusion furnace (or heating furnace) to melt the solder paste and thereby solder-bond the piezoelectric device to the circuit board.

However, the package and the circuit board may have different coefficients of thermal expansion. This may generate stress that acts upon the solder joining the package to the circuit board, possibly causing the solder to crack. This problem may be obvious with any piezoelectric devices using ceramic-made, for example, alumina-made packages in combination with glass epoxy substrates, and even more obvious with heat-resistant applications, typically, in-vehicle piezoelectric devices having their packages and circuit boards be exposed to high temperatures. Such a severe environment even further elevates the coefficient of thermal expansion of the circuit board as compared to the coefficient of thermal expansion of the package, easily incurring fatigue failure of the solder.

The occurrence of cracks, which is barely a serious issue to be taken into account at normal temperatures, may be more noticeable at high temperatures. In addition to this problem, an impact, if imposed on the package and the circuit board, may trigger abrasion in any cracked part of the solder.

The applicant of this application found and disclosed some technical solutions to these problems (for example, JP 2006-32645 A).

SUMMARY OF THE INVENTION

The patent literature 1 describes restricting a terminal electrode area of the package to a certain proportion of a bottom surface area of the package to encourage the formation of a solder fillet, thereby increasing a bonding strength to the circuit board. A problem with this solution; a restricted proportion of the terminal electrode area to the bottom surface area of the package, is that area reduction of the terminal electrodes is unavoidable in the pursuit of package miniaturization, conducing to a smaller junction area of the package to the circuit board.

This invention was accomplished to solve these problems. This invention is directed to suppressing the risk of solder cracks for an improved bonding reliability between an electronic component-use package and a circuit board without the need to restrict the terminal electrode area of the package to a certain proportion of its bottom surface area.

To this end, the inventors of this invention learnt through their diligent researches and studies that they should focus on chamfered parts of terminal electrodes formed on the bottom surface of a base holding an electronic component element at positions that face corner parts of the base bottom surface. Then, the inventors found out that the occurrence of solder cracks was effectively suppressible by defining a certain angular range for angles of chamfer of these chamfered parts, and they finalized the invention.

An electronic component-use package according to this invention includes at least a base that holds an electronic component element, the electronic component-use package further including a terminal electrode disposed on a bottom surface of the base, the terminal electrode being electrically connected to a circuit board externally provided, wherein the terminal electrode has a chamfered part facing a corner part of the bottom surface of the base and having an angle of chamfer ranging in ±10 degrees to a reference line, and the reference line is a perpendicular line to a straight line that connects the corner part of the bottom surface of the base to a central part on one side of the terminal electrode in proximity to a center point of the bottom surface of the base, the reference line passing through the chamfered part of the terminal electrode.

The base is a component that is at least required of the electronic component-use package according to this invention. This package may or may not have a lid.

The terminal electrode is formed on the base bottom surface for electrical connection of the electronic component-use package to the circuit board, and the terminal electrode has a chamfered part facing a corner part of the base bottom surface. The chamfered part has an angle of chamfer ranging in ±10 degrees to the reference line. An electro conductive jointing material by which the terminal electrode is joined to the circuit board, such as solder, may start to crack in a maximum stress-bearing section in vicinity of an outer-peripheral corner part of the base bottom surface, and the generated cracks may progress and spread toward a minimum stress-bearing section at the center of the base bottom surface. As the cracks are progressing then, the chamfered part of the terminal electrode formed at a position on the way to the minimum stress-bearing section may effectively disperse the stress and deflect the crack progressing direction. Thus, forming the chamfered part may effectively deter the crack progression.

According to preferred embodiments of this invention, a bump including a metal film is integrally formed on the terminal electrode, the bump has a chamfered part facing the corner part of the bottom surface of the base, the chamfered part of the bump has an angle of chamfer ranging in ±10 degrees to a reference line for bump, and the reference line for bump is a perpendicular line to a straight line that connects the corner part of the bottom surface of the base to the central part on the one side of the terminal electrode in proximity to the center point of the bottom surface of the base, the reference line passing through the chamfered part of the bump.

In these embodiments, the bump having a chamfered part facing the corner part of the base bottom surface is formed on the terminal electrode, and the chamfered part has an angle of chamfer ranging in ±10 degrees to the reference line for bump. An electro conductive jointing material by which the terminal electrode is joined to the circuit board, such as solder, may start to crack in the maximum stress-bearing section in vicinity of the outer-peripheral corner part of the base bottom surface, and the generated cracks may progress and spread toward the minimum stress-bearing section at the center of the base bottom surface. As the cracks are progressing then, the chamfered part of the bump on the terminal electrode, in combination with the chamfered part of the terminal electrode, may effectively disperse the stress and deflect the crack progressing direction. As a result, the crack progression may be more effectively deterred.

According to other embodiments of this invention, the chamfered parts of the terminal electrode and of the bump both have a planar shape and have equal angles of chamfer.

These embodiments, by arranging the chamfered parts of the terminal electrode and of the bump to be equal in angle of chamfer, may more effectively deter the crack progression.

According to other embodiments, the angles of chamfer range in ±5 degrees.

These embodiments may even further effectively deter the crack progression.

According to other embodiments of this invention, the terminal electrode has the chamfered parts facing corner parts at both ends on one side of the bottom surface of the base, a castellation vertically extending is formed on a side surface of the base corresponding to the one side of the bottom surface of the base, the castellation has a side surface electrode formed in continuity with the terminal electrode, and the castellation has an opening width small enough to fall between points of intersection at which extension lines respectively along directions of chamfer of the chamfered parts of the terminal electrode intersect with the one side of the bottom surface of the base.

In these embodiments, the castellation formed on the side surface of the base corresponding to the one side of the base bottom surface has an opening width small enough to fall between points of intersection at which extension lines respectively along directions of chamfer of the chamfered parts of the terminal electrode intersect with the one side of the base bottom surface. The castellation, if greater in opening width, may extend as far as the chamfered part of the terminal electrode, disturbing the advantageous feature of the chamfered part; dispersion of the stress. In that case, the resulting stress concentration may no longer deter the crack progression, which, however, may be avoidable by forming the castellation according to these embodiments. Further advantageously, when the terminal electrode is joined to the circuit board with the electro conductive jointing material such as solder, the solder partly climbs up on the side surface electrode of the castellation, forming a fillet. This may afford an improved bonding strength and facilitate optical tests performed on the fillet shape.

According to other embodiments of this invention, the bottom surface of the base has a rectangular shape in plan view and a pair of opposing sides including the one side, and a pair of the terminal electrodes is formed along the pair of opposing sides of the bottom surface of the base. The castellations vertically extending are formed on both side surfaces of the base on the pair of opposing sides of the bottom surface of the base, and the castellations each have the side surface electrode formed in continuity with the terminal electrodes.

In these embodiments, the terminal electrodes are formed in a pair along the pair of opposing sides of the base bottom surface rectangular in plan view, and the terminal electrodes each have chamfered parts facing the corner parts at both ends on each of the opposing sides. Though cracks possibly originate in the maximum stress-bearing sections at four corners of the base bottom surface rectangular in plan view, the cracks may be deterred from progressing and spreading toward the minimum stress-bearing sections at the center of the base bottom surface.

According to preferred embodiments of this invention, the electronic component-use package further includes a lid for hermetical seal of an upper opening of the base, wherein the base has a multilayered structure including a plurality of layers vertically stacked on each other, and the castellation has a smaller opening size in at least an uppermost one of the plurality of layers of the base than in the other ones of the plurality of layers.

These embodiments may provide for a greater sealing area when an upper part of the base that includes the uppermost layer is sealed with the lid, affording an improved sealing performance. On the other hand, the castellations greater in opening size and continuous to the side surface electrodes may be formed on the side surfaces in a lower part of the base that include the other layers. This may enhance the solidity and firmness of electrical connection using an electro conductive jointing material such as solder.

A piezoelectric device according to the invention includes any one of the electronic component-use packages according to the invention and the described embodiments, and a piezoelectric vibration piece as the electronic component element.

This invention may afford an improved bonding reliability between the package of the piezoelectric device and the circuit board.

An electro conductive jointing material by which the terminal electrode is joined to the circuit board, such as solder, may start to crack in maximum stress-bearing sections in vicinity of outer-peripheral corner parts of the base bottom surface, and the generated cracks may progress toward minimum stress-bearing sections at the center of the base bottom surface. As the cracks are progressing then, the chamfered parts having the specified angles of chamfer and facing the corner parts of the base bottom surface may effectively disperse the stress and deflect the crack progressing direction. Thus, forming the chamfered parts may effectively deter the crack progression, conducing to an improved bonding reliability between the electronic component-use package and the circuit board.

BRIEF DESCRIPTION OF THE DRAWINGS

FIG. 13 is a graphical illustration of changes per angle of chamfer θ in the principal strain along the Y-coordinate direction.

FIG. 22 is a perspective view of a crystal vibrator according to another embodiment of the invention from its bottom-surface side.

DETAILED DESCRIPTION OF THE INVENTION

Hereinafter, embodiments of the invention are described in detail referring to the accompanying drawings. In an embodiment described below, a crystal vibrator is described by way of example of a piezoelectric device of surface mounting type.

Figure 1:
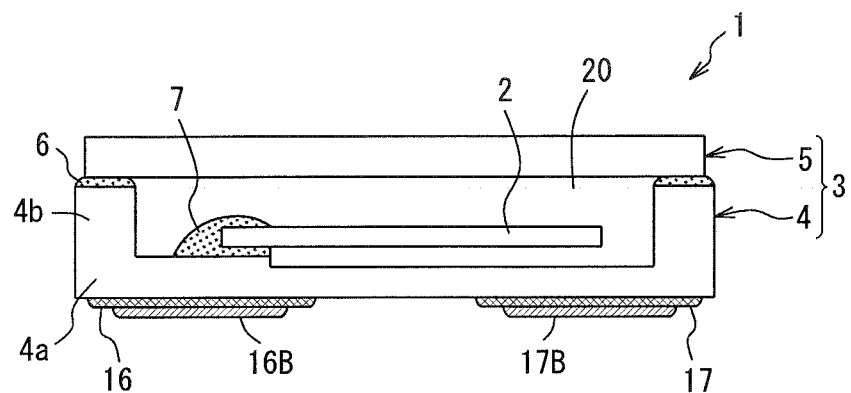
FIG. 1 is a sectional view of a crystal vibrator by way of example of a piezoelectric device according to an embodiment of the invention.
Figure 2:
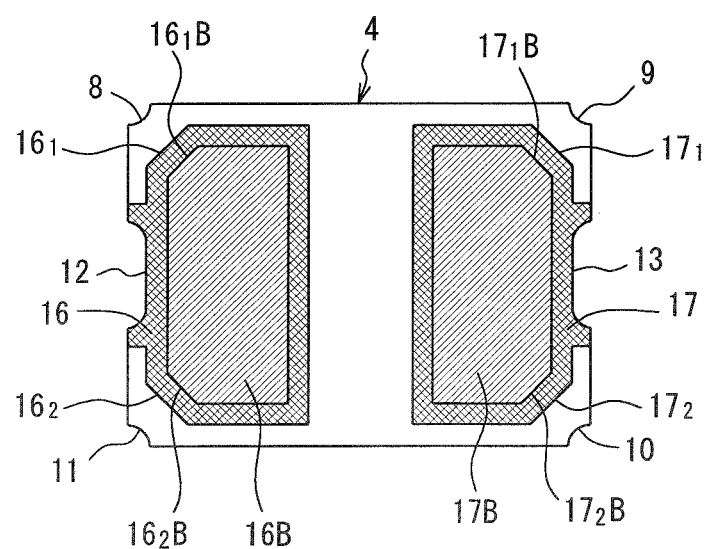
FIG. 2 is a bottom surface view of the crystal vibrator illustrated in FIG. 1.
Figure 3:
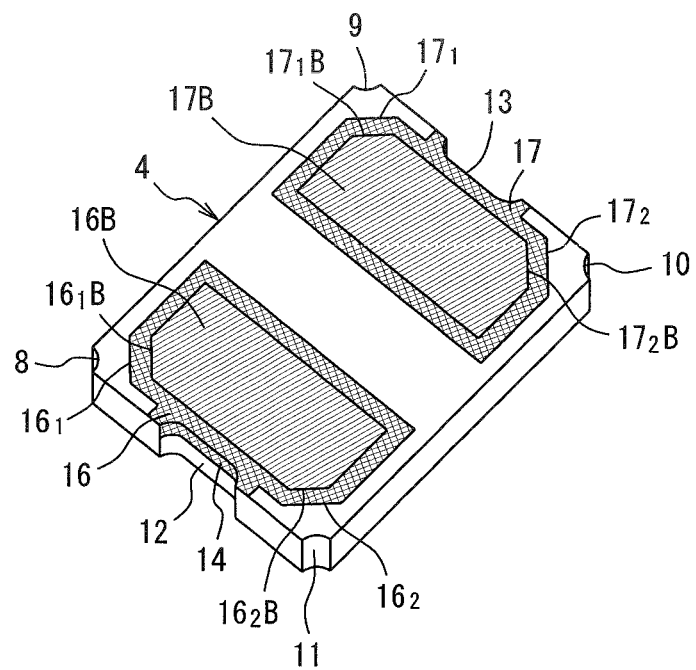
FIG. 3 is a perspective view of the crystal vibrator illustrated in FIG. 1 from its bottom-surface side.

FIG. 1 is a sectional view of a crystal vibrator according to an embodiment of the invention. FIG. 2 is a bottom surface view of the crystal vibrator illustrated in FIG. 1. FIG. 3 is a perspective view of the crystal vibrator from its bottom-surface side.

As illustrated in FIG. 1, a crystal vibrator 1 according to this embodiment has, as an exemplified electronic component element, a crystal vibration piece 2 including AT-cut crystals, and a package 3 that holds and hermetically seals the crystal vibration piece 2. The package 3 includes a base 4 and a lid 5. The base 4 has a recessed portion with an opening on its upper side, in which the crystal vibration piece 2 is placed and held. The lid 5 is for hermetical seal of the crystal vibration piece 2 held in the base 4. An internal space 20 is hermetically sealed by joining the lid 5 to the opening of the base 4 with a sealing material 6. In this internal space 20, the crystal vibration piece 2 is electromechanically bonded with, for example, an electro conductive adhesive 7 to an electrode pad (not illustrated in the drawings) of the base 4.

The base 4 is made from a ceramic material, for example, alumina. As illustrated in FIG. 1, the base 4 has a box-like shape formed by a bottom portion 4a and a bank portion 4b extending upward along the outer periphery of the bottom portion 4a. The base 4 is formed in an upper-opening recessed shape by stacking ceramic layers and sintering them together.

At four corner parts on the outer periphery of the base 4 substantially rectangular in plan view, castellations 8 to 11 dented inward are formed as illustrated in FIGS. 2 and 3, and they are extending from the upper surface to the bottom surface of the base 4. On a side surface of the base 4 between the castellations 8 and 11 and a side surface of the base 4 between the castellations 9 and 11, castellations 12 and 13 dented inward are formed, and they are vertically extending. The castellations 12 and 13 are formed at central parts on opposing short sides of the base 4 substantially rectangular in plan view.

As illustrated in FIG. 3, side surface electrodes 14 and 15 (side surface electrode 15 is not illustrated in the drawing) are formed at lower parts of the vertically extending castellations 12 and 13, i.e., at parts of these castellations closer to the bottom surface of the base 4.

The side surface electrodes 14 and 15 are electrically connected to a pair of terminal electrodes 16 and 17 formed on the bottom surface of the base 4. These terminal electrodes 16 and 17 are connected, with an electro conductive jointing material such as solder, to a circuit board externally provided. A state of connection then may be determinable by checking whether the solder has climbed up on the castellations 12 and 13 where the side surface electrodes 14 and 15 are formed.

The terminal electrodes 16 and 17 on the bottom surface of the base 4 are two symmetrical terminals facing each other along the opposing short sides. The terminal electrode 16 has two opposing chamfered parts $16_1$ and $16_2$ facing two corner parts on both sides of one of the short sides. The terminal electrode 17 has two opposing chamfered parts $17_1$ and $17_2$ facing two corner parts on both sides of the other short side. The chamfered parts $16_1$ and $16_2$, and $17_1$ and $17_2$ have inclined planar faces formed by chamfering the corner parts of the terminal electrodes 16 and 17.

The terminal electrodes 16 and 17 are rectangular in plan view in any parts thereof but where the castellations continuous to the side surface electrodes 14 and 15 and the chamfered parts $16_1$ and $16_2$, and $17_1$ and $17_2$ are formed. The rectangular terminal electrodes 16 and 17 are formed with their short sides facing the long sides of the rectangular bottom surface of the base 4, and their long sides facing the short sides of the bottom surface.

On the terminal electrodes 16 and 17, bumps 16B and 17B are formed substantially alike but slightly smaller in area in plan view than the terminal electrodes 16 and 17. The bumps 16B and 17B, as with the terminal electrodes 16 and 17, have chamfered parts $16_1B$ and $16_2B$, $17_1B$ and $17_2B$ facing the four corner parts of the rectangular bottom surface of the base 4. The chamfered parts $16_1B$ and $16_2B$, $17_1B$ and $17_2B$ of the bumps 16B and 17B have inclined planar faces formed by chamfering similarly to the chamfered parts $16_1$ and $16_2$, $17_1$ and $17_2$ of the terminal electrodes 16 and 17.

The bumps 16B and 17B are formed to be integral with the terminal electrodes 16 and 17 by stacking metalized (with tungsten or molybdenum) layers substantially equally shaped on upper parts of the terminal electrodes 16 and 17 metalized with the same metal.

The terminal electrodes 16 and 17 and the bumps 16B and 17B are both structurally characterized in that these metalized materials are sintered to be integral with the base 4, the metallized upper parts are plated with nickel, and the nickel-plated upper parts are further overlaid with gold.

The terminal electrodes 16 and 17 are electrically connected to the electrode pad (not illustrated in the drawings) in the internal space 20 of the base 4 illustrated in FIG. 1 through the side surface electrodes 14 and 15 formed on the castellations 12 and 13.

Extraction electrodes (not illustrated in the drawings) of the crystal vibration piece 2 are connected to the electrode pad with, for example, the electro conductive adhesive 7, and the crystal vibration piece 2 is thereby held in the base 4. On front and back surfaces of the crystal vibration piece 2 are formed the extraction electrodes and a pair of driving electrodes also not illustrated in the drawings.

The lid 5 for hermetical seal of the base 4 is made from a ceramic material such as alumina in the form of a plate. The lid 5 is sealably bonded to the base 4 with the sealing material 6 such as glass. The lid 5, though rectangular in plan view similarly to the base 4, is shaped slightly smaller than the base 4.

The crystal vibration piece 2 is placed and held in the internal space 20 of the base 4 thus structured and sealed therein by the lid 5. Then, the crystal vibration piece 2 is further hermetically sealed by, for example, fusion bonding using a heating furnace. As a result, a piezoelectric device using the electronic component-use package is obtained.

The crystal vibrator, a final product, is then joined, with an electro conductive material such as solder, to an upper part of the electrode pattern on the circuit board made from a glass epoxy material.

This embodiment provides for a scheme described below to deter the solder crack progression with an aim to improve installation and bonding reliabilities between the electronic component-use package and the circuit board.

Figure 4:
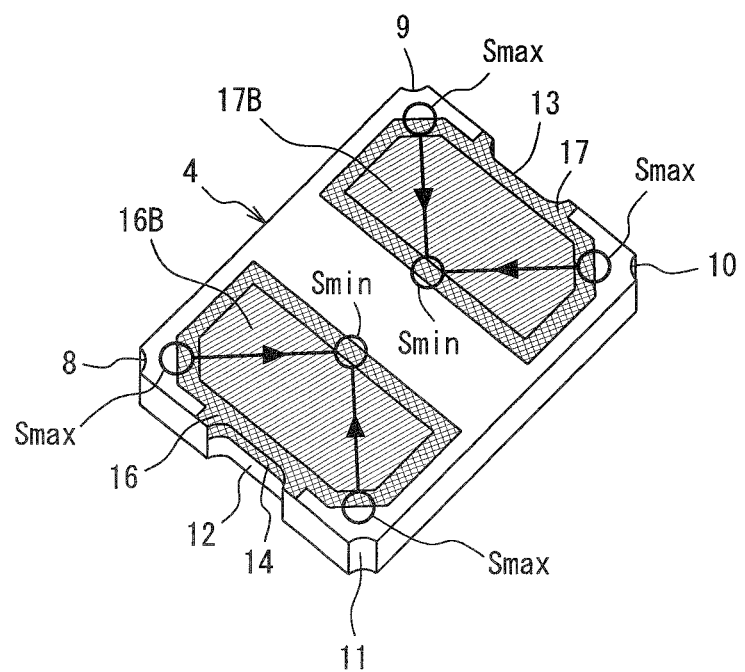
FIG. 4 is a drawing illustrated to describe, as per stress distribution, directions in which solder cracks progress and spread.

In case of any difference between coefficients of thermal expansion of the electronic component-use package and the circuit board, generating stress acting upon the solder used as an electro conductive material that joins the package to the circuit board, the solder is likely to start to crack in maximum stress-bearing sections S max in vicinity of outer-peripheral corner parts of the bottom surface of the base 4 as illustrated in FIG. 4. The heavy stress may continuously affect cracks generated in the solder, causing the cracks to progress and spread toward minimum stress-bearing sections S min at the center of the bottom surface of the base 4. In the end, the cracks may be spread all over the terminal electrodes 16 and 17, finally destroying the fusion bond between the package and the circuit board.

The inventors of this invention earnestly worked on a solution for determent of the crack progression. Focusing on the chamfered parts $16_1$ and $16_2$, and $17_1$ and $17_2$ of the terminal electrodes 16 and 17 facing the corner parts of the base 4, they finally found it effective to define a certain range of angles for their angles of chamfer. In this embodiment, the chamfered parts $16_1$B and $16_2$B, $17_1$B and $17_2$B are formed on the bumps 16B and 17B as well as the terminal electrodes 16 and 17, which are all alike in shape in plan view.

In search of chamfered parts shaped effectively for solder crack control, the inventors of this invention carried out a solder crack simulation test directed to the finite element method-based structural analyses. They verified, through the simulation test, solder strain differences between the terminal electrodes 16 and 17 on the back-surface side that are associated with their different shapes to find out desirable shapes of the chamfered parts.

Figure 5:
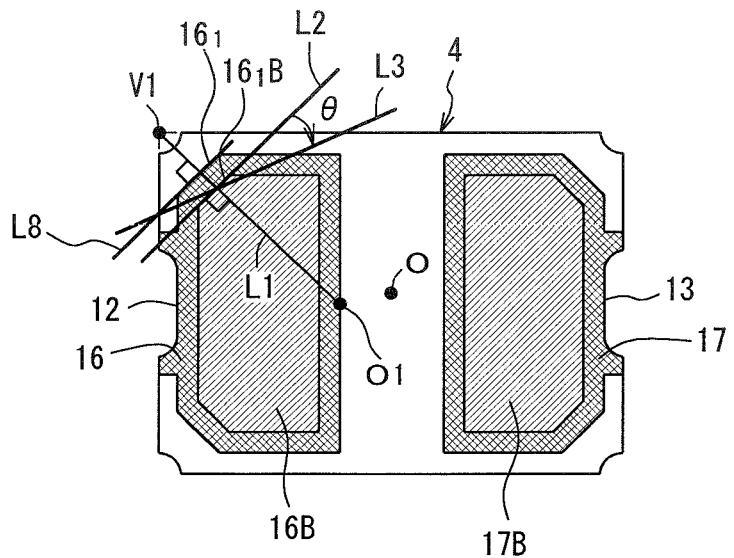
FIG. 5 is a bottom surface view illustrated to describe an angle of chamfer of a chamfered part.

FIG. 5 is a bottom surface view of the base 4 illustrated to describe the solder crack simulation test. Referring to this drawing, a description is given below to the chamfered part $16_1$B of the bump 16B of the terminal electrode 16.

The solder crack simulation test included changes in the angle of chamfer θ of the chamfered part $16_1$B of the solder bump 16. The next paragraph defines the angle of chamfer θ of the chamfered part $16_1$B.

First, a reference line L2 for bump is defined. The reference line L2 for bumps refers to a perpendicular line to a straight line L1 connecting a center O1 on an inner end of the terminal electrode 16 to a peak point V1 at a corner part of the bottom surface of the base 4 and passing through the chamfered part $16_1$B of the bump 16B. The center O1 on an inner end of the terminal electrode 16 specifically refers to a center point on one of long opposing sides of the terminal electrode 16 substantially rectangular in plan view that is closer to a center O of the bottom surface of the base 4.

An angle θ made by the reference line L2 for bump and a straight line L3 along the planar face of the chamfered part $16_1$B of the bump 16B is defined as the angle of chamfer of the chamfered part $16_1$B of the bump 16B.

FIG. 5 is a drawing that explicitly illustrates the angle of chamfer θ. The angle of chamfer θ of the chamfered part $16_1$B of the bump 16B illustrated in this drawing is θ=0 degree, meaning that the straight line L3 along the planar face of the chamfered part is coincident with the reference line L2 for bump. In this drawing, however, the straight line L3 is inclined on purpose relative to the planar face of the chamfered part, so that the angle of chamfer θ is distinctly seeable.

The solder crack simulation test, as well as changing the angle of chamfer θ of the chamfered part $16_1$B of the bump 16B, changed the angle of chamfer θ of the chamfered part $16_1$ of the terminal electrode 16. A reference line L8 refers to a perpendicular line to the straight line L1 connecting the center O1 on the inner end of the terminal electrode 16 to the peak point V1 at the corner part of the bottom surface of the base 4 and passing through the chamfered part $16_1$ of the terminal electrode 16. The angle of chamfer θ of the chamfered part $16_1$ of the terminal electrode 16 is defined as an angle θ made by the reference line L8 and a straight line along the planar face of the chamfered part $16_1$ of the terminal electrode 16.

The reference line L8 that defines the angle of chamfer θ of the chamfered part $16_1$ of the terminal electrode 16 and the reference line L2 that defines the angle of chamfer θ of the chamfered part $16_1$B of the bump 16B are both perpendicular lines to the straight line L1 connecting the center O1 on the inner end of the terminal electrode 16 to the peak point V1 at the corner part of the bottom surface of the base 4 and passing through the chamfered part $16_1$ of the bump 16. Further, these reference lines L2 and L8 are perpendicular lines in parallel with each other and passing through the chamfered part $16_1$ of the terminal electrode 16 and the chamfered part $16_1$B of the bump 16B. The reference lines L2 and L8 are lines passing through points of intersection at which the straight line L1 intersects with the planar faces of the chamfered parts $16_1$ and $16_1$B.

According to this embodiment, the chamfered part $16_1$ of the terminal electrode 16 and the chamfered part $16_1$B of the bump 16B have their angles of chamfer θ be changed so that the planar faces of these chamfered parts are in parallel with each other, as illustrated in FIG. 5. The chamfered part $16_1$ of the terminal electrode 16 and the chamfered part $16_1$, of the bump 16B, therefore, have equal angles of chamfer θ.

Figure 6:
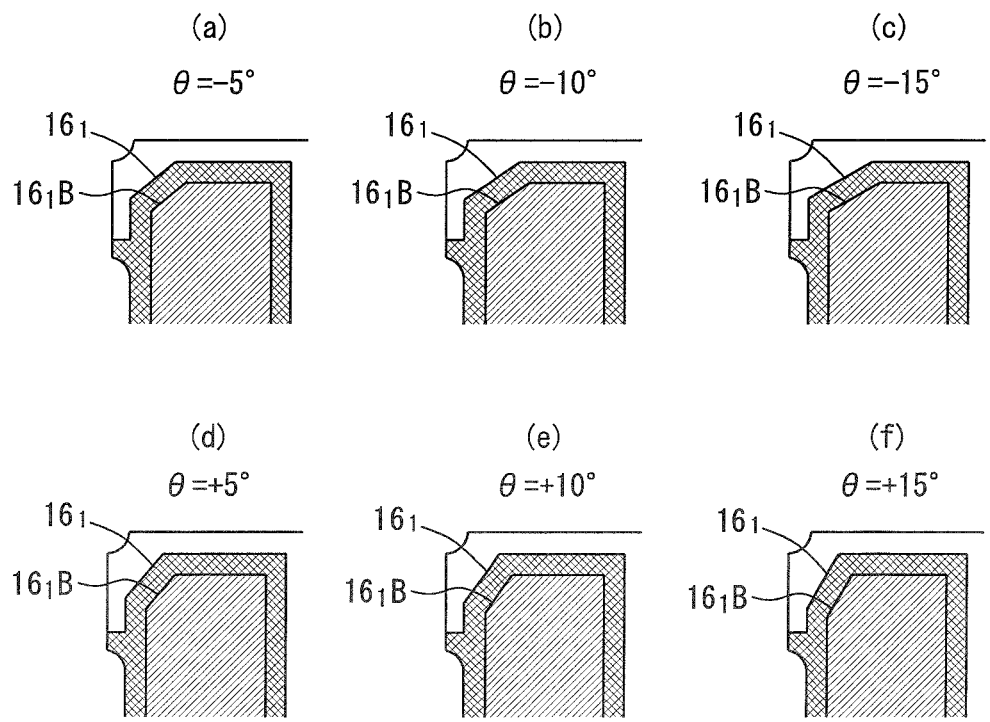
FIG. 6 are drawings of different angles of chamfer evaluated in a simulation test.

In this solder crack simulation test, the angles of chamfer θ of the chamfered part $16_1$ of the terminal electrode 16 and the chamfered part $16_1$B of the bump 16B were each changed by 5 degrees clockwise and counterclockwise, up to 15 degrees in both directions, as illustrated in FIGS. 6 (a) to (f).

Figure 7:
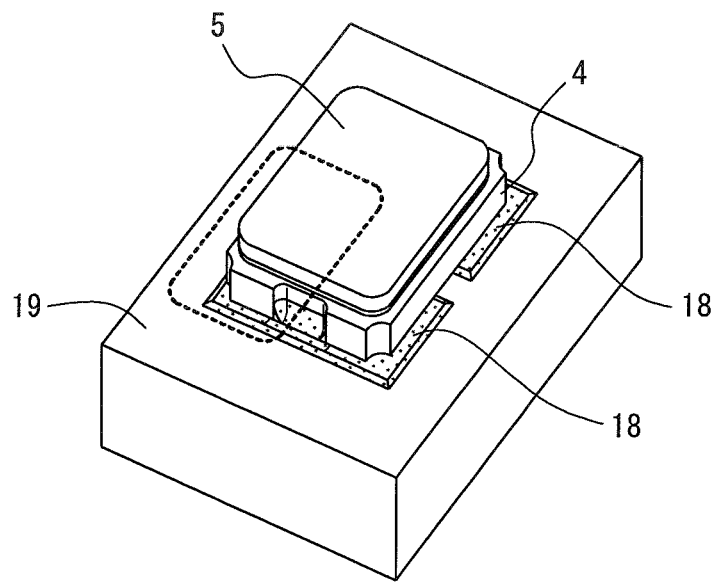
FIG. 7 is a perspective overall view of a simulation model.

FIG. 7 is a drawing of the whole structure of a model used in the simulation test. This simulation model has a structure in which an electronic component-use package including the ceramic base 4 and the ceramic lid 5 joined to the base 4 is mounted on and joined to a glass epoxy substrate 19 with a solder 18.

In this simulation model, its structural elements were respectively sized as below; bottom surface of the base 4 was sized 3.2 mm×2.5 mm, terminal electrodes 16 and 17 were sized 1.2 mm×2.3 mm, and glass epoxy substrate 19 was sized 6.0 mm×5.0 mm×1.6 mm.

The finite element method-based structural calculations used one-fourth part of the whole simulation model of FIG. 7, the one-fourth part of which is a symmetrical part including one corner part as illustrated in this drawing with a broken line. In the example illustrated in FIG. 7, the one corner part is a corner part of FIG. 2 with the castellation 11 formed thereon.

A load in this simulation was +100° C., which was uniformly applied to the whole model, and conditions at +125° C. were calculated on the basis of +25° C. being a reference load. Specifically, in this crack simulation, linear analyses was carried out with room temperature (25° C.) at which stress starts (stress-free temperature) and the application of thermal loads up to 125° C.

Figure 8:
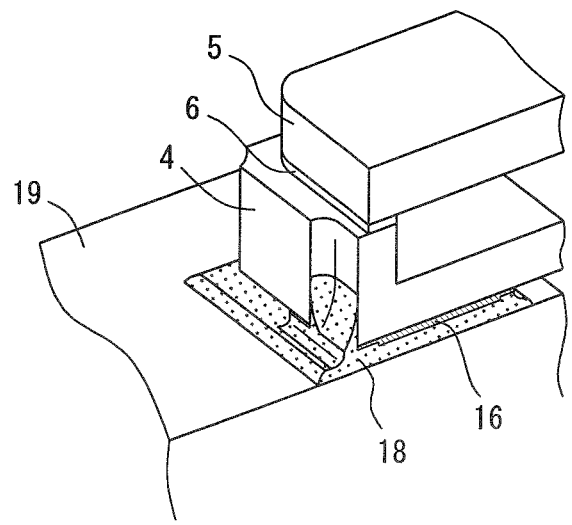
FIG. 8 is a perspective view of a fourth part of the simulation model used in the simulation test.

Table 1 shows physical values of the materials of the structural elements illustrated in FIG. 8 illustrating an enlarged view of the ¼ simulation model, specifically, terminal electrode 16: tungsten (W), base 4 and lid 5: ceramics, sealing material 6: flint glass, electro conductive material: solder 18, and glass epoxy substrate 19: FR-4.

TABLE 1

|  | Young's modulus (GPa) | Poisson's ratio | Coefficient of linear expansion |
|---|---|---|---|
| W | 407 | 0.17 | 4.5 |
| Ceramics | 316 | 0.24 | 7.2 |
| Flint Glass | 80.1 | 0.27 | 8.5 |
| Solder | 38.5 | 0.38 | 21.7 |
| FR-4 | 27 | 0.15 | 14 |

The result of this simulation is hereinafter described.

Any cracks in the solder are greatly affected by strain variations imposed on the solder. Therefore, the inventors placed their focus on the maximum principal strain of the solder. The maximum principal strain is a value calculated by coordinate rotating computation of six components of the stress tensor that are maximized in dilation direction.

Figure 9:
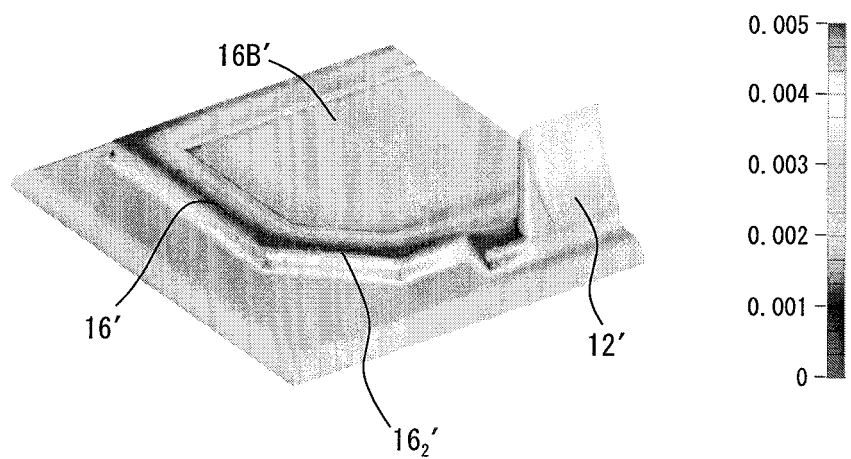
FIG. 9 is a contour drawing of a maximum principal strain in a solder-applied part

FIG. 9 is a contour drawing of the maximum principal strain in a solder-applied part. FIG. 9 illustrates the solder-applied part alone of the ¼ simulation model illustrated in FIGS. 7 and 8. This solder-applied part includes partial shapes 16' and 16B' corresponding to each of the terminal electrode 16 and the bump 16B, and further includes a fillet 12' extending upward corresponding to the castellation 2.

This drawing shows a heavy principal strain generated in a peripheral part $16_2'$ corresponding to the chamfered part $16_2$ of the terminal electrode 16.

The principal strains at different angles of chamfer θ mentioned earlier were evaluated, which is described below.

Figure 10:
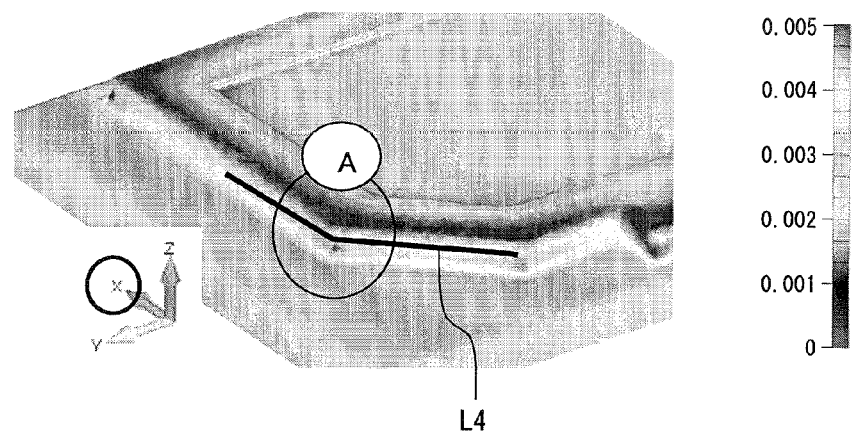
FIG. 10 is a contour drawing of a principal strain along an X-coordinate direction.

As illustrated in FIG. 10, a point A at a corner part of the solder in its short-side direction was defined as a reference X coordinate "0", and the principal strain along an X-coordinate direction coincident with the short-side direction of the terminal electrode 16 was calculated for each of the angles of chamfer θ at a plurality of points including the point A and points on both sides of the point A, as illustrated with a line L4.

Figure 11:
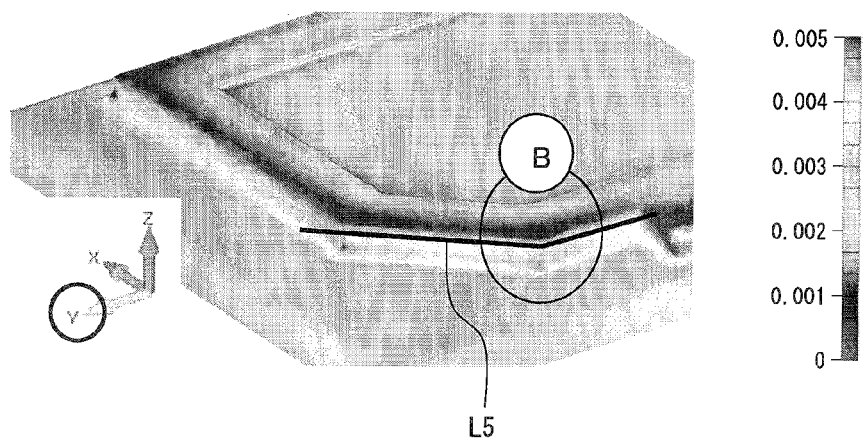
FIG. 11 is a contour drawing of a principal strain along a Y-coordinate direction.

As illustrated in FIG. 11, a point B at the corner part of the solder in its long-side direction was similarly defined as a reference Y coordinate "0", and the principal strain along a Y-coordinate direction coincident with the long-side direction of the terminal electrode 16 was calculated for each of the angles of chamfer θ at a plurality of points including the point B and points on both sides of the point B, as illustrated with a line L5.

Figure 12:
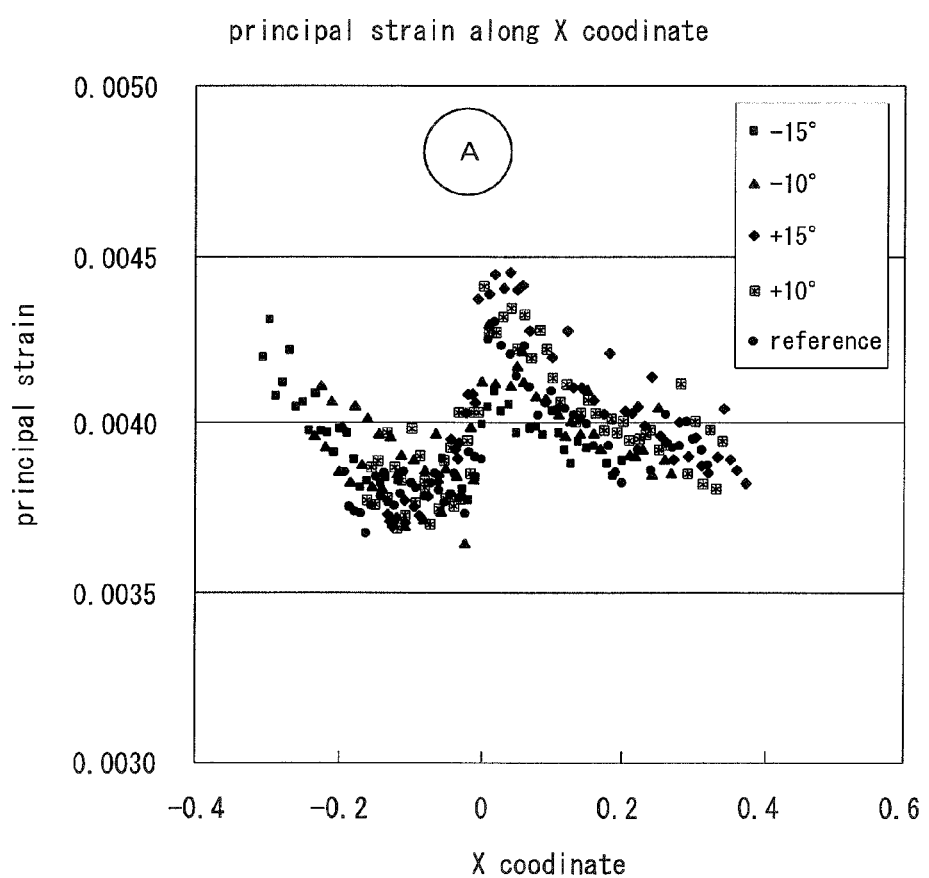
FIG. 12 is a graphical illustration of changes per angle of chamfer θ in the principal strain along the X-coordinate direction.

FIG. 12 shows principal strain changes along the X-coordinate direction at different angles of chamfer θ; θ=0 degree (reference), +10 degrees, +15 degrees, −10 degrees, and −15 degrees. Referring to FIG. 12, the lateral axis (X coordinate) shows positions along the line L4, where the point A of FIG. 10 is the reference X coordinate "0", while the vertical axis shows the principal strains along the X-coordinate direction.

FIG. 13 shows principal strain changes along the Y-coordinate direction at different angles of chamfer θ; θ=0 degree (reference), +10 degrees, +15 degrees, −10 degrees, and −15 degrees. Referring to FIG. 13, the lateral axis (Y coordinate) shows positions along the line L5, where the point B of FIG. 11 is the reference Y coordinate "0", while the vertical axis shows the principal strains along the Y-coordinate direction.

As illustrated in FIG. 12, the principal strains along the X-coordinate direction are relatively greater near the point A, reference X coordinate. As illustrated in FIG. 13, the principal strains along the Y-coordinate direction are relatively greater near the point B, reference Y coordinate. Average values, taken per the angle of chamfer θ, of the principal strains along the X-coordinate direction and the Y-coordinate direction in the range of −0.05 to +0.05 near the reference points A and B were respectively calculated.

Figure 14:
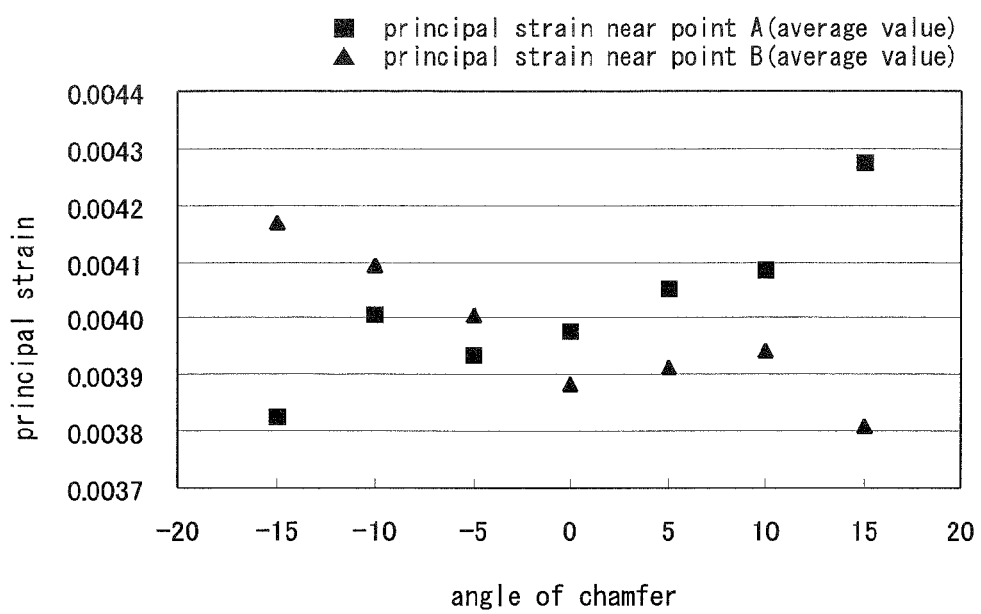
FIG. 14 is a graphical illustration of average values, taken per angle of chamfer θ, of principal stains in vicinity of points A and B.

FIG. 14 shows averages value of the principal strains along the X-coordinate direction near the point A at the corner part and average values of the principal strains along the Y-coordinate direction near the point B at the corner part at different angles of chamfer θ; θ=−15 degrees, −1.0 degrees, −5 degrees, 0 degree, 5 degrees, 10 degrees, and 15 degrees.

Figure 15:
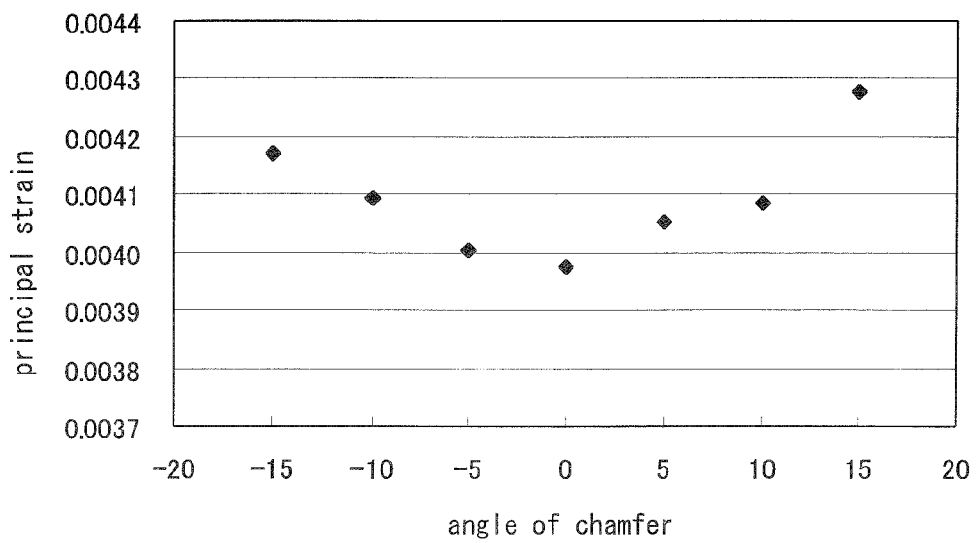
FIG. 15 is a graphical illustration plotted with greater average values of the principal strain averages in vicinity of the points A and B of FIG. 14.

Among the average values of the principal strains along the X-coordinate direction near the corner point A and of the principal strains along the Y-coordinate direction near the corner points B at the different angles of chamfer θ of FIG. 14, the values with greater strains were extracted and plotted in FIG. 15.

It is known from FIG. 15 that the principal strain average values are smaller at angles of chamfer θ more approximate to θ=0 degree. In order to reduce the principal strains for crack control, the angle of chamfer θ may preferably range in ±0.10 degrees, and more preferably range in ±5 degrees.

Figure 16:
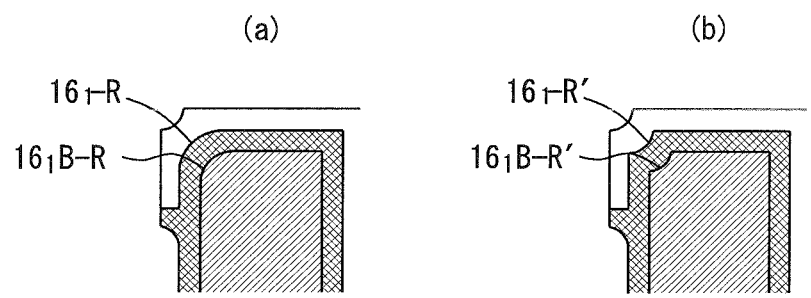
FIG. 16 are drawings of other chamfered parts evaluated in the simulation test.

FIGS. 16 (a) and (b) illustrate other optional shapes, apart from the planar shape described so far, of the chamfered parts of the terminal electrodes 16 and 17 and the bumps 16B and 17B respectively facing the corner parts of the base 4. FIG. 16 (a) is a drawing of chamfered parts $16_1$-R and $16_1$B-R rounded so as to bulge outward (outer-round shape), and FIG. 16 (b) is a drawing of chamfered parts $16_1$-R' and $16_1$B-R' dented inward (inner-round shape). A simulation test was carried out on these optionally-shaped chamfered parts, which demonstrated greater principal strains in both of these chamfered parts in contrast to the planar chamfered parts.

As for the terminal electrodes 16 and 17 formed on the bottom surface of the base 4 and the bumps 16B and 17B formed further thereon, this embodiment regulates the angles of chamfer θ of their chamfered parts $16_1$ to $16_4$, $17_1$ to $17_4$, and $16_1$B to $16_4$B to range in ±10 degrees, or preferably to range in ±5 degrees. A possible scenario with the electro conductive material that joins the terminal electrodes 16 and 17 to the circuit board, such as solder, is that cracks originate in any of the maximum stress-bearing sections at the outer peripheral corner parts on the base bottom surface progress and then spread toward the minimum stress-bearing sections at the center on the base bottom surface. The chamfered parts $16_1$ to $16_4$, $17_1$ to $17_4$, and $16_1$B to $16_4$B, however, may serve to effectively disperse the stress that would otherwise be spread and may also serve to deflect the crack progressing direction. These advantageous effects may successfully deter the crack progression.

So far were described the angles of chamfer θ of the chamfered parts $16_1$, $16_2$, $17_1$, $17_2$, $16_1$B, $16_2$B, $17_1$B, and $17_2$B of the terminal electrodes 16 and 17 and the bumps 16B and 17B. This embodiment further regulates opening sizes of the castellations 12 and 13 formed on the side surfaces of the base 4 as hereinafter described, thereby further effectively suppressing the occurrence of solder cracks.

Figure 17:
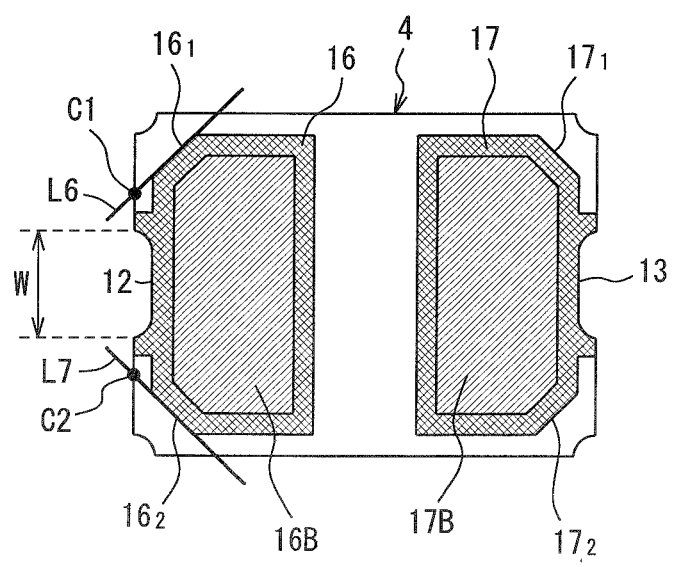
FIG. 17 is a bottom surface view of a base illustrated to describe the opening width of a castellation.

FIG. 17 is a bottom surface view of the base 4 illustrated to describe sizes of the castellations 12 and 13 formed on both side surfaces of the base 4. While the size of the castellation 12 alone is described below, the same goes for the other castellation 13.

In this embodiment, referring to the drawing, C1 and C2 refer to points of intersection at which extension lines L6 and L7 respectively intersect with a short side of the bottom surface of the base 4. The extension lines L6 and L7 are extending along the directions of chamfer of the opposing chamfered parts $16_1$ and $16_2$ of the terminal electrode 16 facing the corner parts at both ends of the short side. An opening width W of the castellation 12 formed substantially at the center of the short side, i.e., an opening width W of the castellation 12 on the side surface of the base 4 is small enough to fall between the points of intersection C1 and C2. The extension lines L6 and L7 are straight lines along the planar faces of the chamfered parts $16_1$ and $16_2$.

By arranging the opening width of the castellation 12 to be small enough to fall between the points of intersection at which the extension lines L5 and L46 along the planar faces of the chamfered parts $16_1$ and $16_2$ of the terminal electrode 16 intersect with the short side, the solder cracks may be more effectively suppressed. This advantageous effect is described below.

Figure 18:
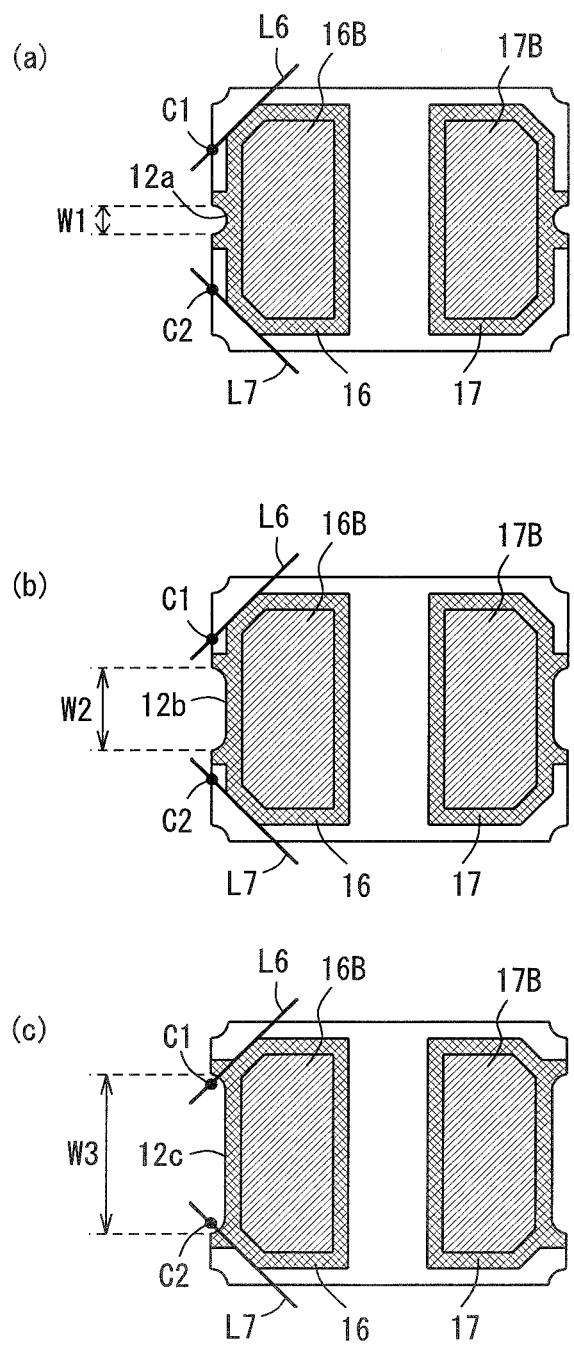
FIG. 18 are drawings of castellations that differ in opening width evaluated in the simulation test.

As illustrated in FIGS. 18 (a) to (c), the inventors of this invention carried out a solder crack simulation test on simulation models in which three castellations 12a to 12c respectively have opening widths W1, W2, and W3 that differ from the opening width W of the castellation 12. The angles of chamfer θ of the chamfered parts $16_1$ and $16_2$, $16_1$B and $16_2$B were set to the reference "0 degree". Comparing these opening widths, the opening width W1 is the smallest width (small), the opening width W2 is an intermediate width between W1 and W3 (mid-sized), and the opening width W3 is the greatest width (large).

As for castellations 12a and 12b illustrated in FIGS. 18 (a) and (b), their opening widths W1 and W2 are small enough to fall between the points of intersection C1 and C2. As for a castellation 12c illustrated in FIG. 18 (c), its opening width W3 is too large to fall between the points of intersection C1 and C2.

Figure 19:
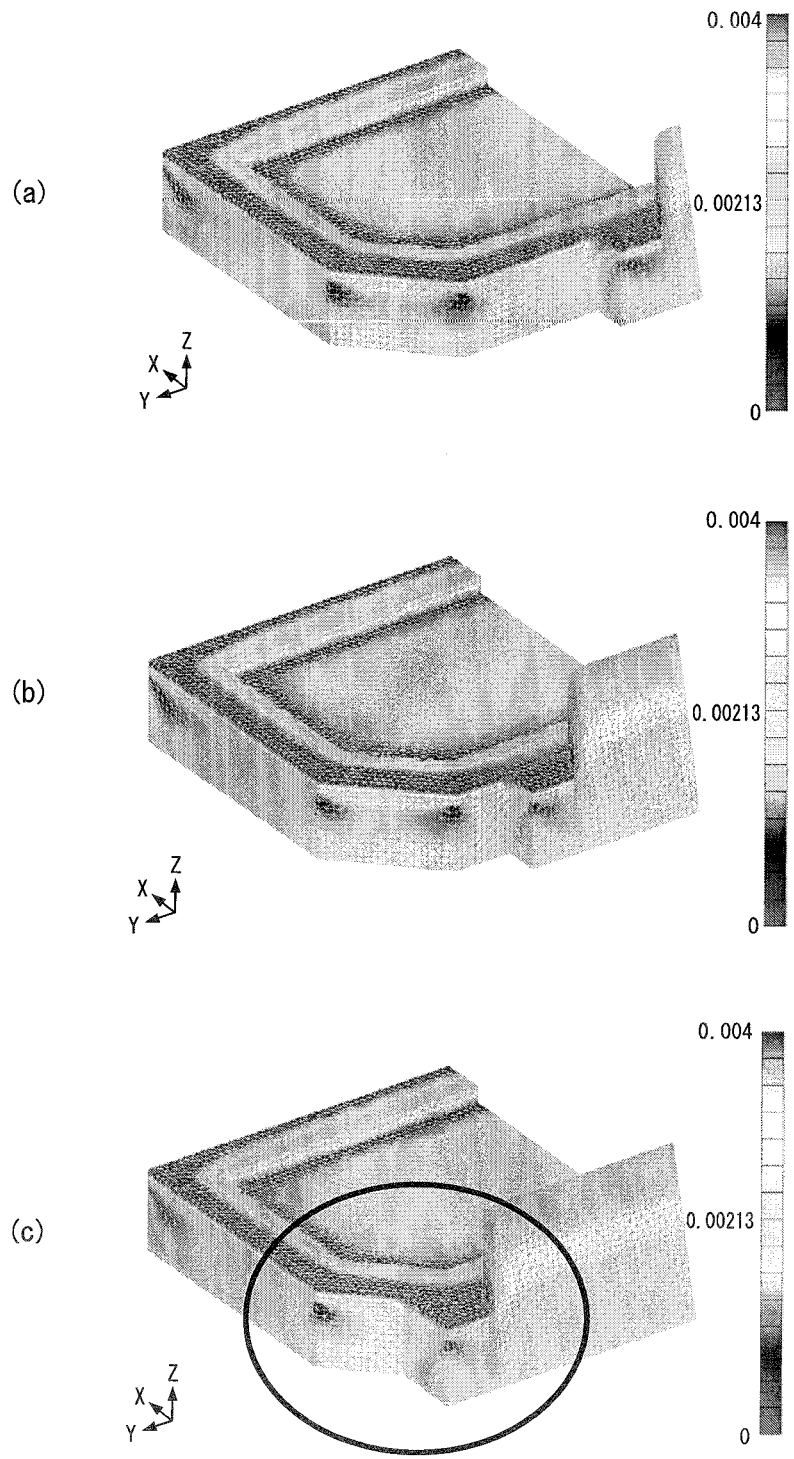
FIG. 19 are contour drawings of maximum principal strains in solder-applied parts of the castellations of FIG. 18 that differ in opening width.

FIG. 19 show simulation results of the castellations 12a to 12c respectively with the opening widths W1, W2, and W3. FIGS. 19 (a) to (c) are contour drawings of maximum principal strains in solder-applied parts of the simulation models having three different castellations 12a to 12c illustrated in FIGS. 18 (a) to (c).

As illustrated in a circled area of FIG. 19 (c), the castellation 12c having a large opening width, in turn, reduces the chamfered part of the terminal electrode 16 formed at the angle of chamfer θ. As a result, adequate dispersion of the stress fails, producing a greater principal strain.

Figure 20:
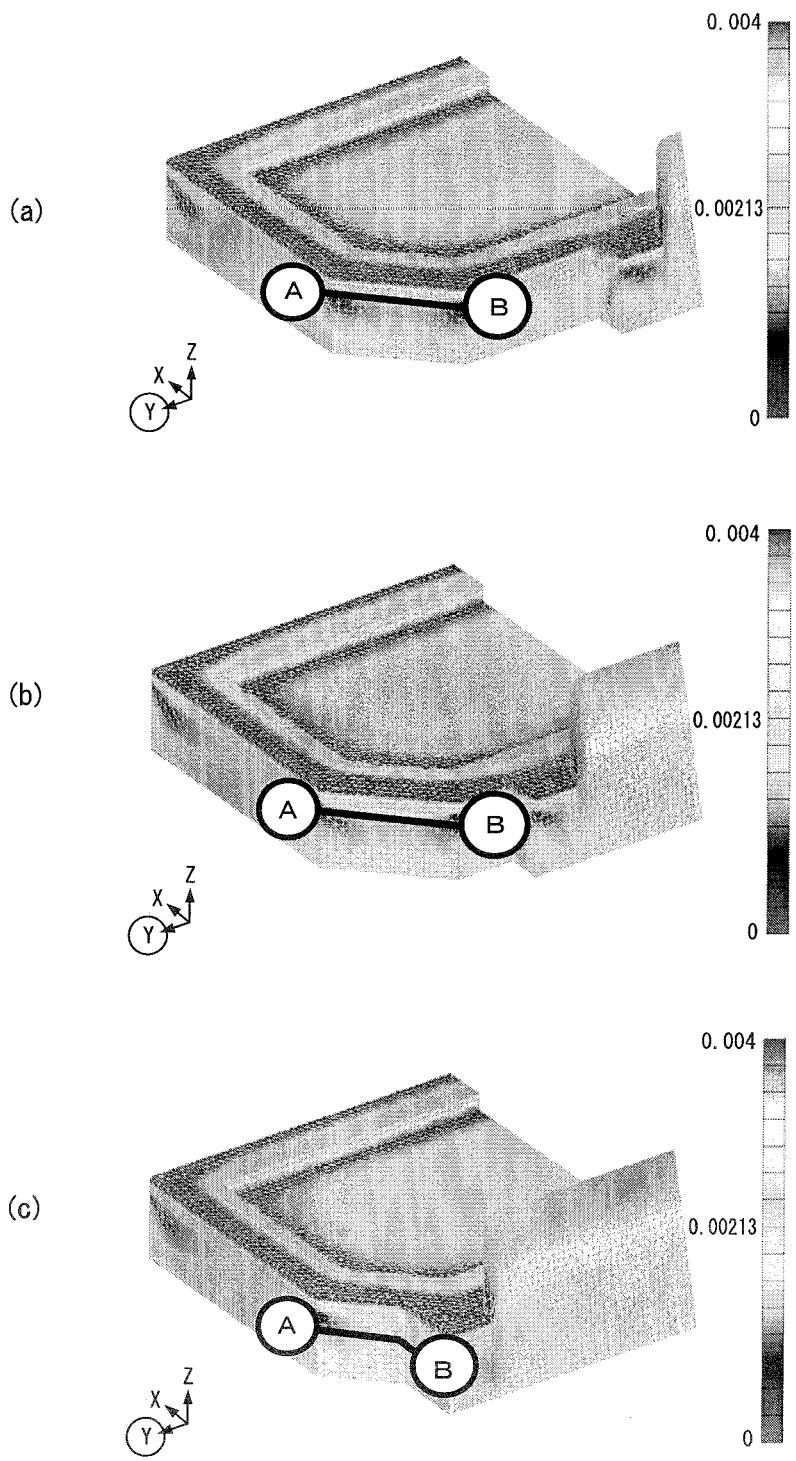
FIG. 20 are contour drawings of principal strains along the X-coordinate direction of the solder-applied parts in the castellations of FIG. 18 that differ in opening width.

FIG. 20 are a contour drawing of solder principal strains along the Y-coordinate directions coincident with the long-side direction of the terminal electrode 16, wherein a point A refers to a corner part in the short-side direction (X-coordinate direction) of the terminal electrode 16, and a point B refers to a corner part in the long-side direction (Y-coordinate direction) of the terminal electrode 10.

Figure 21:
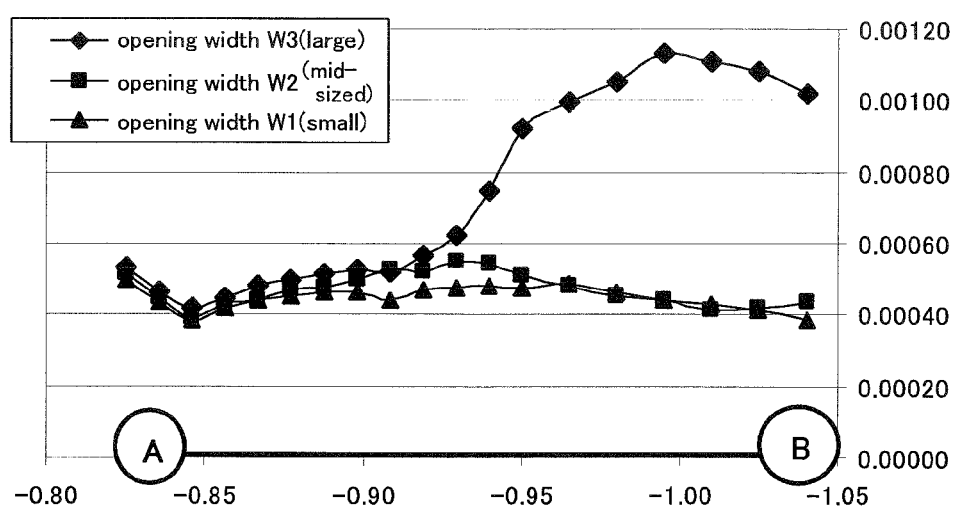
FIG. 21 is a graphical illustration of changes in principal strains between the points A and B of FIG. 20.

FIG. 21 is a graphical illustration plotted with values of the principal strains between the points A and B.

Referring to FIG. 21, in contrast to the castellations 12a and 12b with the opening widths W1 and W2 small enough to fall between the points A and B, a significant increase of the principal strain, from an A-B mid point toward the point B, is observed in the castellation 12c with the greater opening width W3 than the interval between the points of intersection C1 and C2.

In this embodiment, the castellations 12 and 13 on the both side surfaces of the base 4 are formed so as to have their opening widths W fall between the points of intersection at which the extension lines along the directions of chamfer of the chamfered parts $16_1$ and $16_2$, $17_1$ and $17_2$ of the terminal electrodes 16 and 17 intersect with the short sides of the bottom surface of the base 4. Then, the castellations 12 and 13 may be favorably formed without compromising determent of the crack progression effected by the chamfered parts $16_1$ and $16_2$, $17_1$ and $17_2$ of the terminal electrodes 16 and 17. Further advantageously, adverse effects may be avoidable for the chamfered parts $16_1$B and $16_2$B, $17_1$B and $17_2$B of the bumps 16B and 17B that deter the crack progression in collaboration with the chamfered parts $16_1$ and $16_2$, $17_1$ and $17_2$ of the terminal electrodes 16 and 17.

The side surface electrodes 14 and 15 are formed in continuity with the terminal electrodes 16 and 17 on the castellations 12 and 13 on the side surfaces of the base 4 with opening widths small enough to fall between the points of intersection. When the terminal electrodes 16 and 17 are joined to the circuit board with an electro conductive jointing material such as solder, the solder partly climbs up on the side surface electrodes 14 and 15 of the castellations 12 and 13, forming fillets. This may increase the bonding strength, facilitating optical tests performed on the fillet shapes.

In this embodiment, the openings of the castellations 12 and 13 formed on the side surfaces of the base 4 are sized equally in upper and lower directions. In other embodiments of this invention, the openings of the castellations 12 and 13 may be sized differently in upper and lower directions.

FIG. 22 (a) is a perspective view of the base bottom surface illustrated with the castellations 12 and 13 having openings smaller in their upper parts than lower parts. FIG. 22 (b) is an enlarged view of the castellation 12 and its vicinity. Though the castellation 12 alone is illustrated in FIG. 22, the same goes for the other castellation 13.

As illustrated in FIG. 22 (b), the castellation 12 has an opening with an upper part 12₂ smaller than a lower part 12₁ having the side electrode 14 formed thereon.

In the illustrated examples, the opening upper part 12₂ of the castellation 12 is smaller in both width and depth than the lower part 12₁. Instead, the opening upper part 12₂ may be smaller in width or depth than the lower part 12₁.

The base 4 includes a plurality of multilayered ceramic layers. The smaller opening upper part 12₂ of the castellation 12 includes at least an uppermost one of the plurality of layers, while the lower part 12₁ includes the rest of the layers.

As illustrated in FIG. 1, the lid 5 is joined to the upper part of the base 4 to hermetically seal the base 4. In this embodiment, the castellations 12 and 13 formed on the side surfaces of the base 4 have openings smaller in size in their upper parts. This may increase a sealable area, affording an improved sealing performance.

On the other hand, the lower parts of the castellations 12 and 13 formed on the side surfaces of the base 4, where the side surface electrodes 14 and 15 are formed, are greater in opening size. Then, the solder, used as an electro conductive material, may successfully effect reliable and firm electrical connection.

In the embodiments described so far, the angles of chamfer θ of the chamfered parts 16₁ to 16₄, and 17₁ to 17₄ of the terminal electrodes 16 and 17 and the angles of chamfer θ of the chamfered parts 16₁B and 16₂B, 17₁B and 17₂B of the bumps 16B and 17B are all equal angles. However, some or all of the angles of chamfer θ of these chamfered parts may be arranged to differ.

The bumps 16B and 17B on the terminal electrodes 16 and 17 may or may not be formed.

In the embodiments described so far, the invention was applied to a crystal vibrator. This invention is not necessarily limited to crystal vibrators but may be applicable to other electronic components of surface mounting type such as crystal filters and crystal oscillators.

The package 3 described in the embodiments is equipped with the lid 5. This invention, however, includes lid-free packages.

The invention claimed is:

1. An electronic component-use package, comprising at least a base that holds an electronic component element, the electronic component-use package further comprising a terminal electrode disposed on a bottom surface of the base, the terminal electrode being electrically connected to a circuit board externally provided, wherein
the terminal electrode has a chamfered part facing a corner part of the bottom surface of the base and having an angle of chamfer ranging in ±10 degrees to a reference line,
the reference line is a perpendicular line to a straight line that connects the corner parts of the bottom surface of the base to a central part on one side of the terminal electrode in proximity to a center point of the bottom surface of the base, the reference line passing through the chamfered part of the terminal electrode,
a bump including a metal film is integrally formed on the terminal electrode, and the bump has a chamfered part facing the corner part of the bottom surface of the base,
the chamfered part of the bump has an angle of chamfer ranging in ±10 degrees to a reference line for bump, and
the reference line for bump is a perpendicular line to a straight line that connects the corner part of the bottom surface of the base to the central part on the one side of the terminal electrode in proximity to the center point of the bottom surface of the base, the reference line passing through the chamfered part of the bump.

2. The electronic component-use package as claimed in claim 1, wherein
the respective chamfered part of the terminal electrode and of the bump each have a planar shape and both have equal angles of chamfer.

3. The electronic component-use package as claimed in claim 2, wherein
the terminal electrode has a respective said chamfered part facing a respective said corner part at each of both ends on the one side of the bottom surface of the base,
a castellation vertically extending is formed on a side surface of the base corresponding to the one side of the bottom surface of the base,
the castellation has a side surface electrode formed in continuity with the terminal electrode, and
the castellation has an opening width small enough to fall between points of intersection at which extension lines respectively along directions of chamfer of the chamfered parts of the terminal electrode intersect with the one side of the bottom surface of the base.

4. A piezoelectric device, comprising:
the electronic component-use package as claimed in claim 3; and
a piezoelectric vibration piece as the electronic component element.

5. A piezoelectric device, comprising:
the electronic component-use package as claimed in claim 2; and
a piezoelectric vibration piece as the electronic component element.

6. The electronic component-use package as claimed in claim 1, wherein
the angle of chamfer of the chamfered part of the terminal electrode ranges in ±5 degrees.

7. A piezoelectric device, comprising:
the electronic component-use package as claimed in claim 6; and
a piezoelectric vibration piece as the electronic component element.

8. The electronic component-use package as claimed in claim 1, wherein
the terminal electrode has a respective said chamfered part facing a respective said corner part at each of both ends on the one side of the bottom surface of the base,
a castellation vertically extending is formed on a side surface of the base corresponding to the one side of the bottom surface of the base,
the castellation has a side surface electrode formed in continuity with the terminal electrode, and
the castellation has an opening width small enough to fall between points of intersection at which extension lines respectively along directions of chamfer of the chamfered parts of the terminal electrode intersect with the one side of the bottom surface of the base.

9. The electronic component-use package as claimed in claim 8, wherein
the bottom surface of the base has a rectangular shape in plan view and a pair of opposing sides including the one side,
a pair of the terminal electrodes is formed along the pair of opposing sides of the bottom surface of the base, and the castellations vertically extending are formed on both side surfaces of the base corresponding to the pair of opposing sides of the bottom surface of the base.

10. A piezoelectric device, comprising:
the electronic component-use package as claimed in claim 9; and
a piezoelectric vibration piece as the electronic component element.

11. The electronic component-use package as claimed in claim 8, further comprising a lid for hermetical seal of an upper opening of the base, wherein
the base has a multilayered structure including a plurality of layers vertically stacked on each other, and
the castellation has a smaller opening size in at least an uppermost one of the plurality of layers of the base than in the other ones of the plurality of layers.

12. A piezoelectric device, comprising:
the electronic component-use package as claimed in claim 8; and
a piezoelectric vibration piece as the electronic component element.

13. The electronic component-use package as claimed in claim 1, wherein
the terminal electrode has a respective said chamfered part facing a respective said corner part at each of both ends on the one side of the bottom surface of the base,
a castellation vertically extending is formed on a side surface of the base corresponding to the one side of the bottom surface of the base,
the castellation has a side surface electrode formed in continuity with the terminal electrode, and
the castellation has an opening width small enough to fall between points of intersection at which extension lines respectively along directions of chamfer of the chamfered parts of the terminal electrode intersect with the one side of the bottom surface of the base.

14. A piezoelectric device, comprising:
the electronic component-use package as claimed in claim 13; and
a piezoelectric vibration piece as the electronic component element.

15. A piezoelectric device, comprising:
the electronic component-use package as claimed in claim 1; and
a piezoelectric vibration piece as the electronic component element.

* * * * *